United States Patent [19]
Weiser

[11] Patent Number: 5,606,298
[45] Date of Patent: Feb. 25, 1997

[54] ELECTRICAL RELAY

[75] Inventor: Josef Weiser, Hohenschaeftlarn, Germany

[73] Assignee: Siemens Aktiengesellschaft, Munich, Germany

[21] Appl. No.: 496,516

[22] Filed: Jun. 29, 1995

[30] Foreign Application Priority Data

Jul. 15, 1994 [DE] Germany .................. 44 25 077.1

[51] Int. Cl.⁶ ...................................... H01H 51/22
[52] U.S. Cl. ................................ 335/78; 335/83
[58] Field of Search .................... 335/78–86, 124, 335/128, 130, 131; 439/68–73, 83, 525, 526

[56] References Cited

U.S. PATENT DOCUMENTS 5,007,844  4/1991  Mason et al. .................. 439/68
5,216,397  6/1993  Matsuoka et al. ................ 335/83

FOREIGN PATENT DOCUMENTS

0171808B1  8/1985  European Pat. Off. .
3430589C2  2/1991  Germany .

*Primary Examiner*—Lincoln Donovan
*Attorney, Agent, or Firm*—Hill, Steadman & Simpson

[57] ABSTRACT

In an electrical relay for integration on printed circuit boards, terminal leads thereof emerge from an upper side of a housing that faces away from a floor side or from the printed circuit board, and have bent-over sections extending along sidewalls of the housing down into the region of the floor side, where they form press-in pins or SMT solder terminals. As a result thereof, a decoupling of the press-in stems from the seal leadthroughs at the housing occurs, so that a de-adjustment in the interior of the relay due to the press-in is avoided.

11 Claims, 4 Drawing Sheets

1

ELECTRICAL RELAY

BACKGROUND OF THE INVENTION

The invention is directed to an electrical relay having a housing that comprises a floor side for putting in place on a printed circuit board and from which terminal leads that are provided with terminal lugs for contacting on the printed circuit board emerge.

In traditional relays, the terminal leads usually emerge from the floor side of the housing and the terminal lugs they form are soldered into bores of the printed circuit board proceeding from the bottom side of the printed circuit board. Recently, what is referred to as the surface mounting technique (SMT) has become more and more common, especially for small components, whereby the components have flat terminal lugs lying on the printed circuit board and are soldered by introducing heat from the upper side. A onetime, albeit brief-duration, but nonetheless high thermal load, this arises for the component parts. In order to be able to mount and solder relays together with other components in a uniform work cycle, the terminal leads of these relays that emerge at the floor side or from the sidewalls in the floor-proximate region are also bent over to form flat contacts parallel to the floor side (EP 0 171 808 B1). What this means for the relays is that materials and technologies must satisfy the most stringent demands, this being expressed in high manufacturing costs. Among other things, there is thus a risk that a de-adjustment will occur in the inside due to the differences in the thermal expansion of the materials; this is especially caused by the proximity of the solder locations to the housing lead-throughs in the lower housing region. Due to the free inside volume that is necessarily present in relays, the great heating also effects a great increase in the pressure of the air in the inside of the housing. This can lead to a loss of tightness.

In order to avoid the disadvantages occurring during soldering, it has likewise already been proposed to design the terminal leads of relays as press-in stems, so that the relay can be put in place on the printed circuit board after the soldering and can be contacted with a press-in technique (DE 34 30 589 C2). Since the press-in stems in previous proposals and their press-in shoulders are applied to the terminal leads more or less directly where these emerge from the lower region of the relay housing, there is a risk that the press-in forces will be transmitted directly onto the sealed lead-through region and into the interior of the relay, where they can have a negative effect on the sealing and on the adjustment values of the relay.

SUMMARY OF THE INVENTION

An object of the present invention is to structurally design a relay of the type initially cited such that heat and mechanical press-in forces in the region of the terminal lugs cannot influence the sealing and the adjustment in the inside of the relay.

This object is achieved in that the terminal leads emerge from the upper side of the housing facing away from the floor side and have bent-over sections extending along sidewalls of the housing down into the region of the floor side, where they form the terminal lugs.

The critical idea of the invention is thus comprised in turning the relay over, compared to traditional formats, so that the terminal leads no longer emerge directly from the floor side or from the floor-proximate region, but from the upper side of the relay that faces away from the printed circuit board and are then guided down at the housing sides on the basis of an appropriate shaping, forming corresponding terminal lugs, preferably designed as press-in pins, thereat. As a result thereof, the terminal leads have a greater length, so that the forces occurring upon press-in are not transmitted or are only transmitted to a slight extent onto the seal zones lying at the upper side of the housing, i.e. they cannot produce any damage to the tightness thereat. In addition, stresses due to different thermal expansions of the relay and of the printed circuit board are decoupled from the press-in zones. The press-in connection is thus not jeopardized as a result. The high temperature loads on the relay are entirely eliminated when the terminal lugs are designed as press-in pins or lugs, this enabling the use of more cost-beneficial materials under certain circumstances. A further advantage of the terminal leads emerging at the upper side is that they are easily accessible for tests at the built-in relay.

Although the invention is essentially conceived for application of the press-in technique, i.e. for a designing of the terminal lugs as press-in pins, some of the advantages also take effect when the terminal lugs are designed for the surface mounting technique (SMT). Given the application of heat from above that is required for the SMT soldering, this heat is especially rapidly transmitted to the solder locations by the terminal leads running down at the sidewalls of the relay, so that only a brief-duration thermal influence is required. In this case, too, the seal locations are also far away from the solder locations and are decoupled therefrom, so that the risk of a de-adjustment is thereby also reduced.

Also having an especially beneficial effect in this case of SMT soldering is the fact that the exit side of the terminal leads that is formed by a base or pedestal and by a sealing casting compound, and that forms the floor side in traditional relays, now represents the upper side in the relay designed according to the invention, and faces toward the solder heat emission. While the housing cap is usually formed of thermoplastics, the base is made of a shape-stable material, and epoxy resin that, as a duroplastic material, is thermally substantially more stable, usually serves as casting compound. As a result of the inversion of upper side and floor side of the invention compared to traditional relays, that side of the relay that is less sensitive to thermal irradiation faces toward the soldering heat.

If insulation problems visa vis neighboring components arise due to the terminal leads proceeding at the outside of the housing, then these can be eliminated by additional films, and especially, however, by a subsequently pluggable super-cap made of an insulator.

DESCRIPTION OF THE PREFERRED EMBODIMENT

Figure 1:
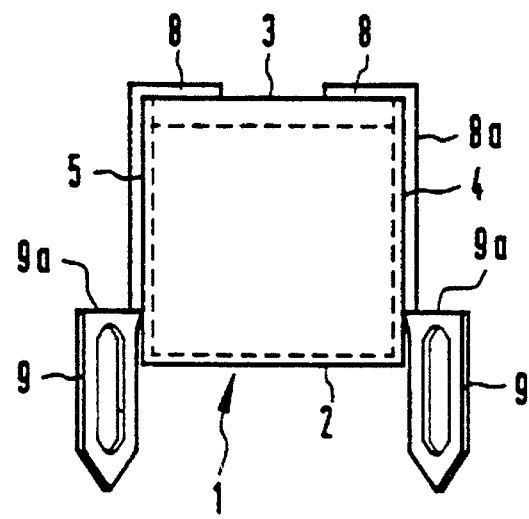
FIGS. 1–3 show in three different views a relay designed according to the invention with press-in stems.
Figure 2:
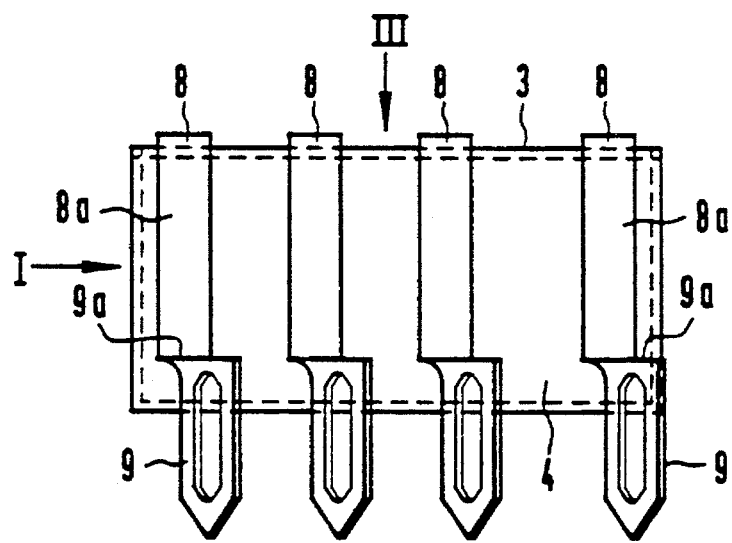
Figure 3:
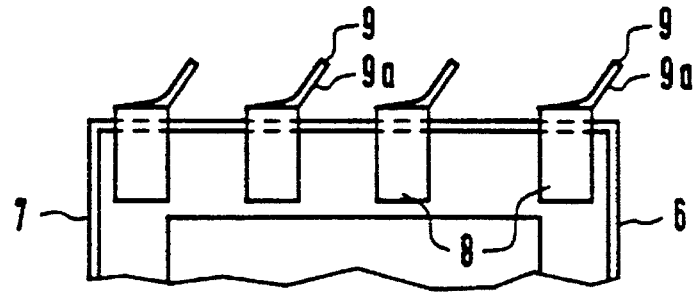

The relay shown in FIGS. 1 through 3 has a housing 1 that contains an arbitrarily designed relay system (not visible) in its interior. The housing has a closed floor side 2 for being put in place onto a printed circuit board, an upper side 3 lying opposite the floor side, as well as longitudinal sidewalls 4 and 5 and transverse sidewalls 6 and 7. Terminal leads 8 for the contacts and the coil winding of the relay emerge from the upper side 3, whereby the leadthroughs of the terminal leads and, potentially, other housing gaps in the upper side 3 are sealed, as usually occurs in the floor side given traditional relays. The terminal leads 8 formed of sheet metal strips are bent over the housing edges of the upper side and have their middle sections 8a running along the longitudinal sides 4 and 5 of the relay toward the bottom, where they are crimped in the proximity of the floor side for forming press-in stems 9 with press-in shoulders 9a formed at the upper side.

Figure 4:
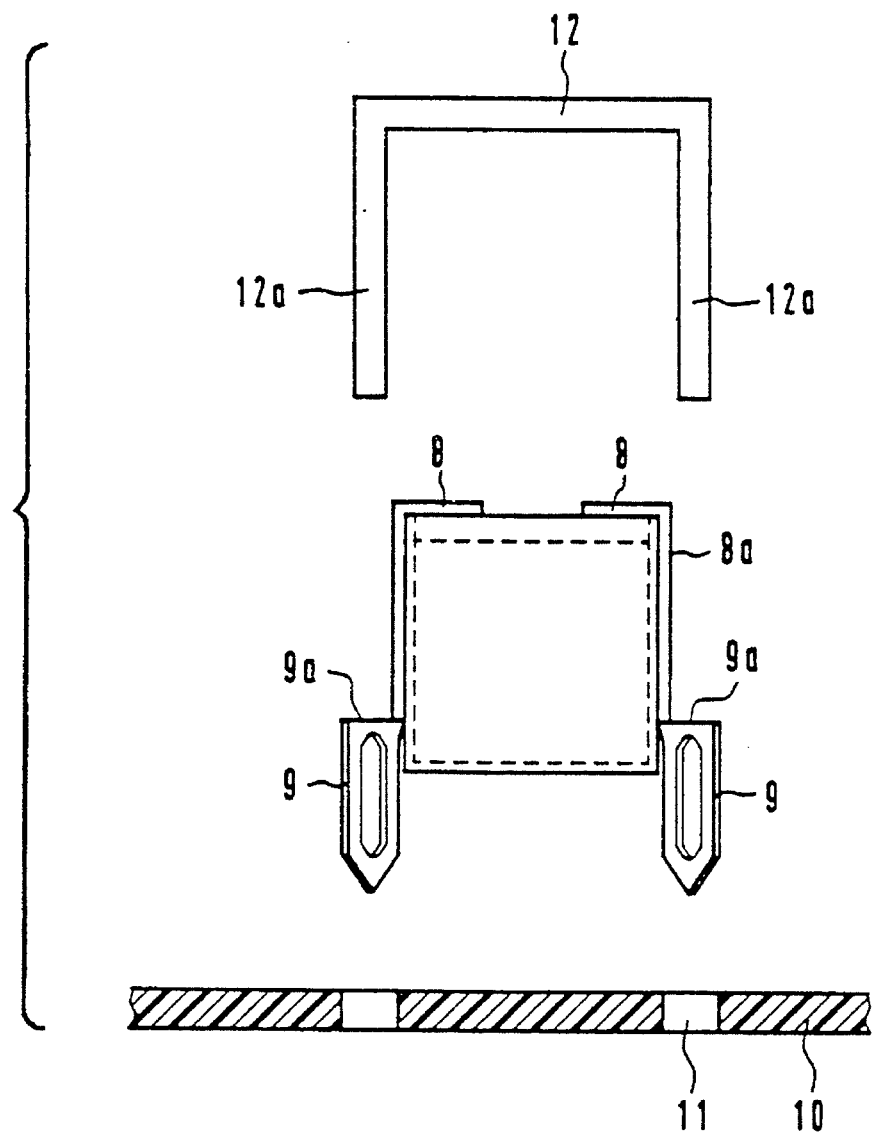
FIG. 4 illustrates mounting arrangement for a relay having press-in stems.

The mounting of the relay according to FIGS. 1 through 3 is shown in FIG. 4. A printed circuit board 10 has contact bores 11 that are laminated with conductive material in a known way. A relay having the housing 1 and the press-in stems 9 is put in place onto the printed circuit board 10, so that the press-in stems 9 align with the contact bores 11. The press-in stems 9 are pressed into the bores 11 (and thus contacted) with the required press-in force using a U-shaped press-in tool 12 whose legs 12a press against the press-in shoulders 9a. The side legs 12a of the press-in tool 12 are thereby matched to the exterior contours of the housing 1 and the middle sections 8a of the terminal leads such that the latter are held during press-in and are protected from being bent.

Figure 5:
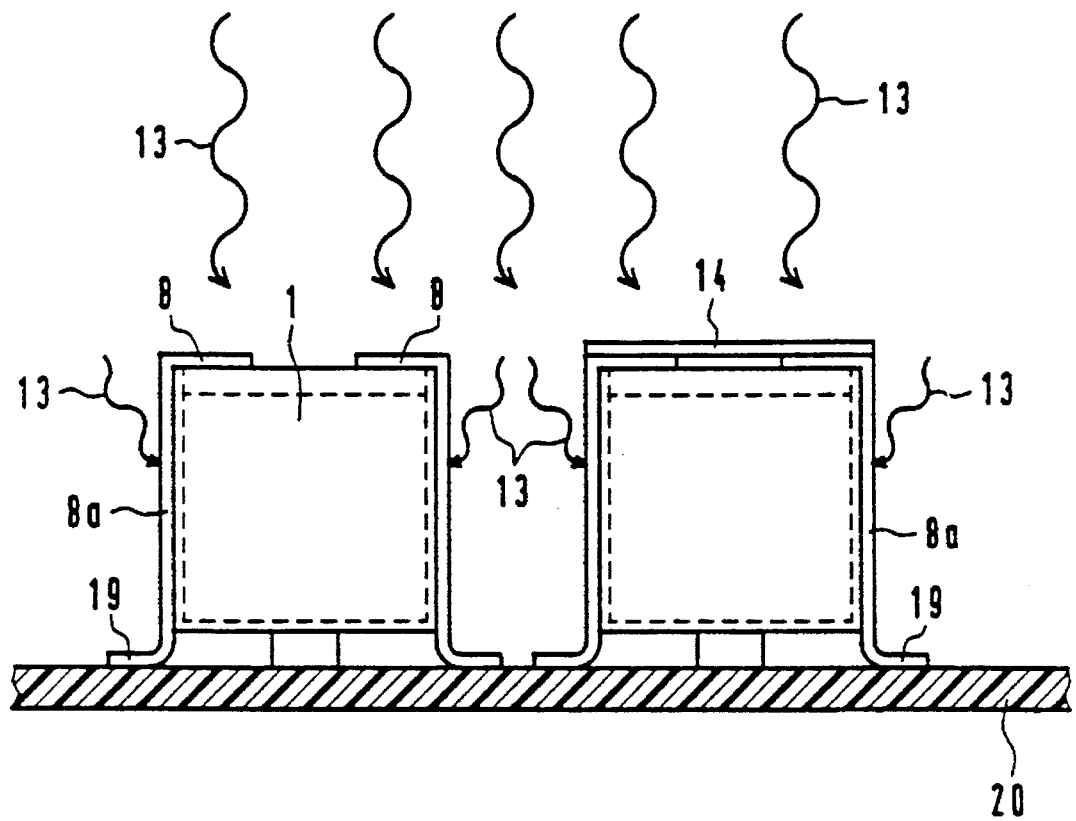
FIG. 5 shows an arrangement of relays with contacts for surface mounting.

FIG. 5 shows another embodiment of the relay of the invention, namely for surface mounting technique (SMT). As in the preceding embodiments, the terminal leads 8 here also emerge at the upper side of the housing 1 and, as in those embodiments, the middle sections 8a are conducted down along the sidewalls. In this case, however, the terminal lugs are designed as SMT contacts 19 that are soldered to the surface of a hole-free printed circuit board 20. The soldering occurs by introducing a thermal radiation 13 that is rapidly carried down to the solder locations by the middle sections 8a of the terminal leads. The soldering duration can be kept very short in this way in order to keep the thermal load on the housing as low as possible. If necessary, the upper housing side with the exit locations of the terminal leads 8 can be covered with a reflective foil 14. In any case, the advantages of a decoupling between the terminal leads or lugs and the exit locations of the terminal leads from the housing also take effect, given this SMT embodiment of a relay.

Figure 6:
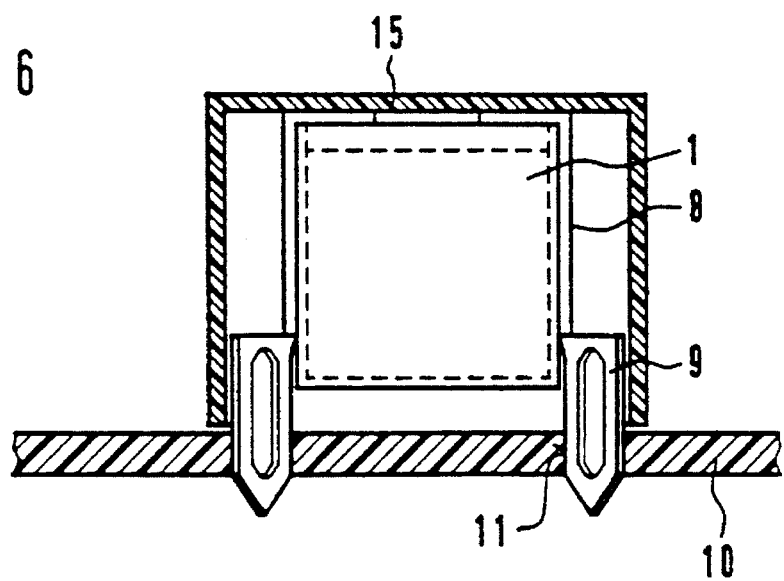
FIG. 6 shows a relay having an insulating super-cap.
Figure 7:
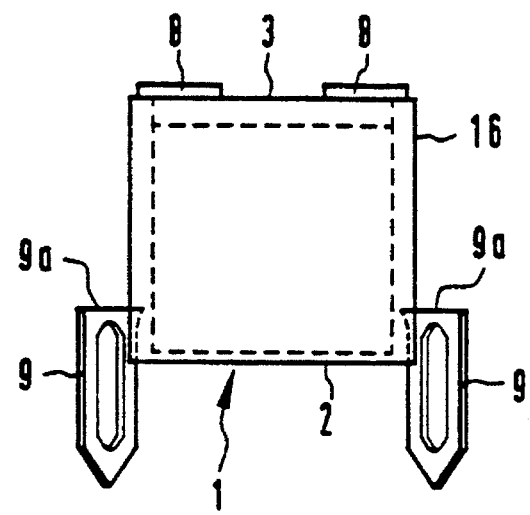
FIGS. 7–9 illustrate a relay in three views corresponding to FIGS. 1–3, but with a modified cap.
Figure 8:
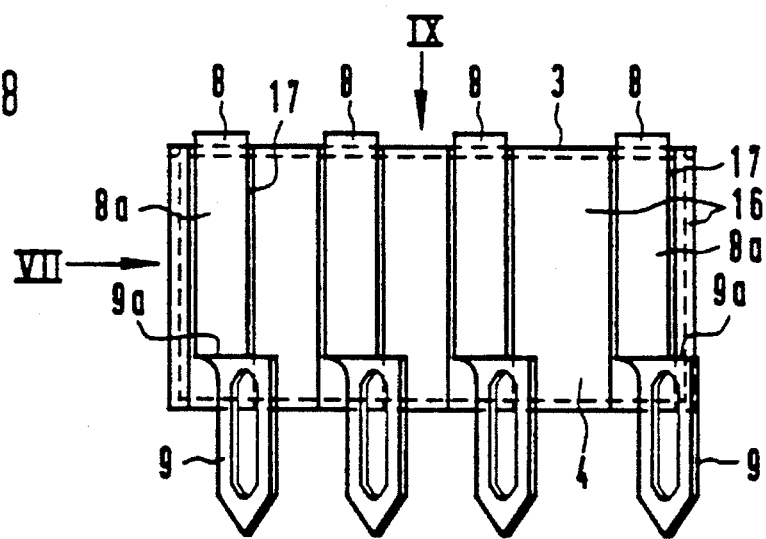
Figure 9:
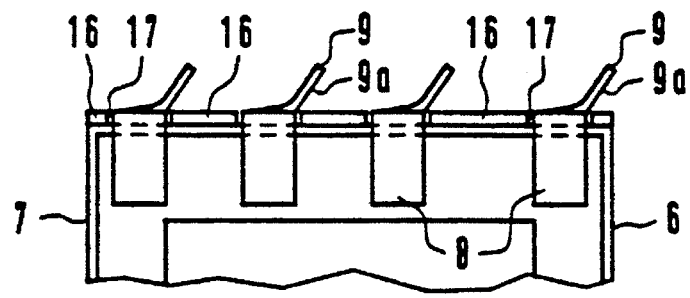

Since the terminal leads in the relay of the invention respectively proceed over the sidewalls or at the outside of the housing sidewalls, the problem of assuring an adequate insulation from a neighboring relay or some other component part can arise under certain circumstances. This can occur, for example, by inserting additional insulating films between the components arranged on the printed circuit board. FIG. 6 shows an advantageous embodiment. An additional super-cap 15 composed of insulator material is employed in this case. This super-cap 15 is inverted over the actual relay housing 1 after the mounting. It is dimensioned such that it also covers the terminal leads 8 proceeding at the outside of the housing and the press-in stems 9 or potentially flat solder terminals 19 according to FIG. 5. Such a super-cap can be manufactured in a simple way by deep-drawing or in some other way.

In the same views as in FIGS. 1–3, FIGS. 7–9 show a somewhat modified embodiment of the relay of the invention. The housing walls—at least at the sides 4 and 5—are thereby reinforced, so that raised sections 16 arise between which vertical channels 17 accept the terminal lead sections 8b. The housing can be stiffened in this way, whereas the terminal leads are set back somewhat from the outside contour into the channels 17.

Although various minor changes and modifications might be proposed by those skilled in the art, it will be understood that I wish to include within the scope of the patent warranted hereon all such changes and modifications as reasonably come within my contribution to the art.

I claim as my invention:

1. An electromagnetic relay, comprising:

an outer housing containing inside thereof a relay, said outer housing having a floor side for placement onto a printed circuit board, and an upper side facing away from the floor side and at which terminal leads emerge to the outside of the housing; and said terminal leads being bent over edges of the upper side and outside thereof sections extending along sidewalls of the outer housing down into a region of the floor side where they form terminal lugs for contacting with electrical contacts of the printed circuit board.

2. A relay according to claim 1 wherein the terminal lugs comprise press-in stems having respective press-in shoulders, and wherein said press-in shoulders extend outwardly away from the respective sidewall of the housing.

3. A relay according to claim 1 wherein the terminal lugs comprise surface-mount contacts.

4. A relay according to claim 3 wherein the surface mount contacts comprise a bottom end of the terminal leads bent at approximately right angles for flush contact with a top of respective contacts on the printed circuit board.

5. A relay according to claim 1 wherein the terminal lugs are bent over approximately parallel to the floor side of the housing for surface mounting.

6. A relay according to claim 1 wherein the sidewalls of the housing comprise channels running from said upper side down to said floor side, and wherein said sections of the terminal leads are arranged in said channels.

7. A relay according to claim 1 wherein portions of the terminal leads located outside the housing are at least partially covered by an additional insulating cap.

8. An electromagnetic relay, comprising:

a housing fully enclosing a relay, said housing having a closed floor side without any terminals protruding therethrough for placement onto a printed circuit board, and an upper side facing away from the floor side and at which terminal leads emerge; and said terminal leads having an "L" shape and extending along an outside surface of said upper side, then over outside edges of said upper side, and then along sidewalls of the housing down into a region of the floor side where they merge with terminal lugs for contacting with electrical contacts of the printed circuit board.

9. An electromagnetic relay, comprising:

a housing fully enclosing a relay, said housing having closed side walls without any terminals protruding therethrough and also a closed floor side without any terminals protruding therethrough for placement onto a printed circuit board, and an upper side facing away from the floor side and at which terminal leads emerge; and said terminal leads running along an outside surface of said upper side and then over and around edges of said upper side of said housing and then along an outside surface of said side walls of the housing down to a vicinity of the floor side where contact portions of the terminal leads for contacting with electrical contacts with the printed circuit board are provided.

10. The relay according to claim 9 wherein said contact portions comprise terminal lugs extending below said floor side having a width which extends laterally outwardly of the sections of the terminal leads extending along the side walls and wherein press-in shoulders are provided at tops of the terminal lugs.

11. The electrical magnetic relay according to claim 9 wherein the contact portions comprise a bottom end of the terminal leads being bent at approximately right angles so that ends of the terminal leads protrude away from the housing and for making flush contact with a top of respective contacts on the printed circuit board.

* * * * *